United States Patent [19]
Keller

[11] 3,939,035
[45] Feb. 17, 1976

[54] METHOD OF PRODUCING MONOCRYSTALLINE SEMICONDUCTOR MATERIAL, PARTICULARLY SILICON, WITH ADJUSTABLE DISLOCATION DENSITY

[75] Inventor: Wolfgang Keller, Munich, Germany

[73] Assignee: Siemens Aktiengesellschaft, Munich & Berlin, Germany

[22] Filed: Apr. 22, 1974

[21] Appl. No.: 462,936

Related U.S. Application Data

[63] Continuation of Ser. No. 230,878, March 1, 1972, abandoned.

[30] Foreign Application Priority Data

Mar. 31, 1971   Germany............................ 2115650

[52] U.S. Cl........... 156/618; 23/301 SP; 23/273 SP; 423/348

[51] Int. Cl.².......................................... B01J 17/18
[58] Field of Search................... 23/301 SP, 273 SP; 423/348; 156/618

[56] References Cited
UNITED STATES PATENTS

| | | | |
|---|---|---|---|
| 3,030,194 | 4/1962 | Emeis............................. | 23/301 SR |
| 3,441,385 | 4/1969 | Schmidt........................... | 23/293 R |

*Primary Examiner*—James H. Tayman, Jr.
*Attorney, Agent, or Firm*—Herbert L. Lerner

[57] ABSTRACT

A method for obtaining a homogeneous dislocation density in a semiconductor rod, by first subjecting the semiconductor rod in a known manner, to a crucible-free zone melting process whereby it becomes monocrystalline and free of dislocations, and thereafter an annealing zone is moved through the rod, under specified conditions.

1 Claim, 1 Drawing Figure

U.S. Patent  Feb. 17, 1976  3,939,035
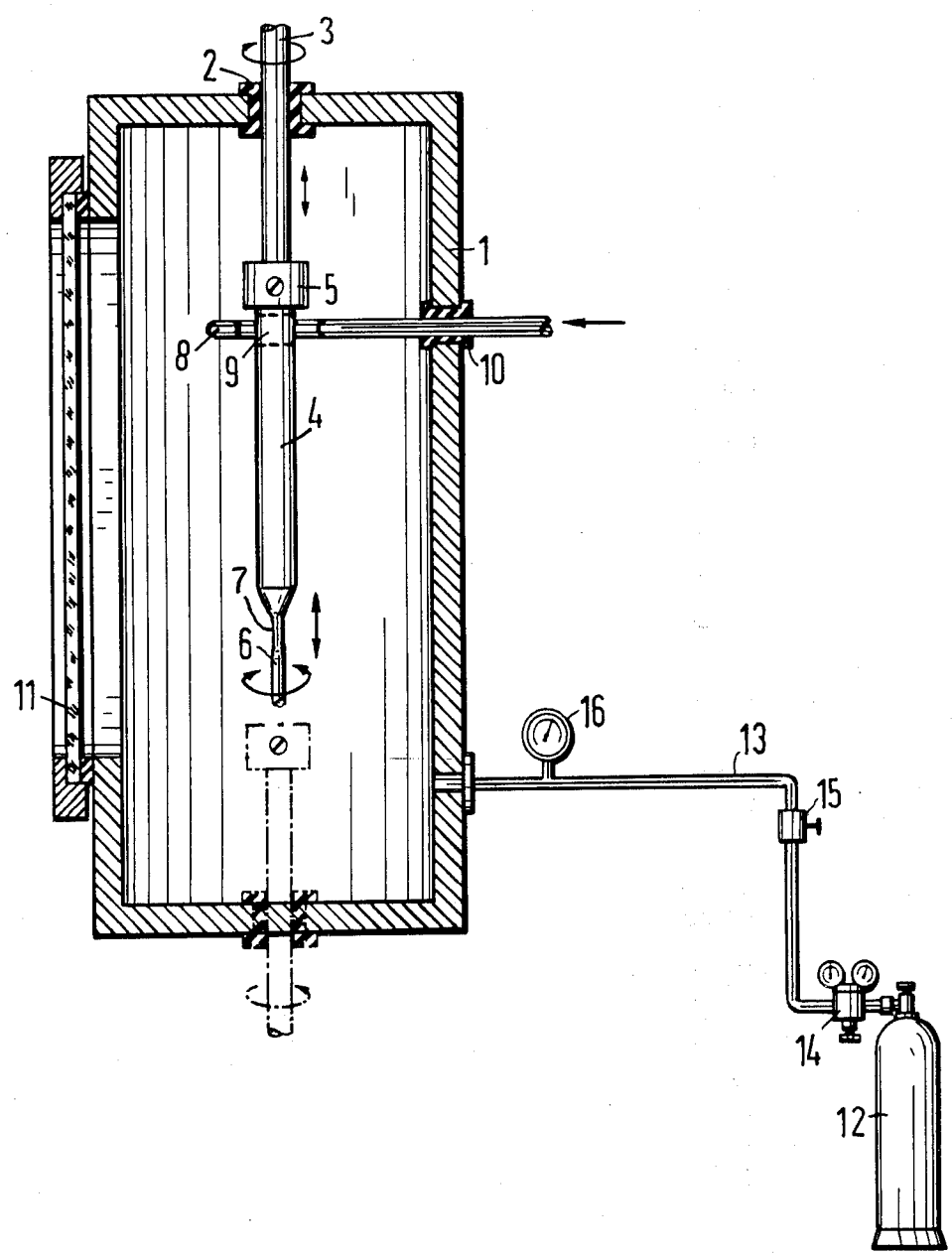

METHOD OF PRODUCING MONOCRYSTALLINE SEMICONDUCTOR MATERIAL, PARTICULARLY SILICON, WITH ADJUSTABLE DISLOCATION DENSITY

This is a continuation of application Ser. No. 230,878, filed Mar. 1, 1972 now abandoned.

The present invention relates to a method of producing monocrystalline, preferably silicon, semiconductor material with an adjustable, uniform dislocation density, by crucible-free zone pulling of a rod which is situated in a recipient held perpendicularly at its end and is surrounded by at least one heating device that can be shifted axially.

"Dislocation density" is understood to mean the number of dislocations per area content and is represented by the etching pit density = Etch Pit Density = E. P. D.

It is known to transform polycrystalline semiconductor rods into rod shaped monocrystals by fusing a monocrystalline crystal seed to one end of the rod and by moving at least once (starting at the fusion point) a melting zone, through the crystalline rod. This zone melting is done in a crucible-free manner, i.e. a melting zone is moved through the perpendicularly positioned crystalline rod, with the aid of an induction heating coil which encloses the rod.

Monocrystals which were produced by crucible-free zone melting, have numerous irregularly distributed dislocation and other crystal structure faults.

Specific features during zone melting, e.g. the melting of a crystal seed in form of a bottle neck type seed or crystal inoculation, as described in German published Application DAS No. 1,128,413, make it possible to obtain semiconductor material that is completely dislocation free. U.S. Pat. No. 3,175,891 of Mar. 30, 1965, corresponding to German published Application DAS No. 1,128,413, describes the method of producing dislocation-free monocrystalline silicone by crucible-free zone melting with a seed crystal involving attaching a seed crystal which has a smaller cross section than the supply rod or the monocrystalline rod produced, and at the beginning of the drawing process on the seed crystal, a bottle-neck type constriction is obtained, which serves to prevent crystal dislocations present in the seed crystal from following the melt-zone.

It is an object of the present invention, however, to produce a monocrystalline semiconductor material with an exactly adjustable dislocation density, which is uniformly distributed across the rod cross section and along the rod length. In addition, the material should be free of so-called "lineages" (small angular grain boundaries) meaning crystal structure faults which represent line dislocations, i.e. lines of higher dislocation density, the cause of whose occurrence is still unsolved. This semiconductor material is used, when semiconductors such as thyristors, diodes and transistors are to be produced by alloying or diffusion processes.

To achieve the object of the invention, commencing with the recognition that the occurrence of dislocations in the crystal is a result of thermal tensions, which are present during the crystal growth, and that the occurrence of lineages can be observed only following the melting processes, it is provided, in order to produce an adjustable dislocation density in the crystal and to prevent lineages, by first subjecting the semiconductor rod in a known manner, to a crucible-free zone melting method whereby it becomes monocrystalline and free of dislocations. Thereafter, an annealing zone is produced in the zone molten rod, which is held only at one end, at a temperature below the melting point of the semiconductor material. The annealing zone is moved through the semiconductor rod, in the same or in opposite direction as during the zone melting process.

Thus, in the method of the present invention, the subsequent annealing process purposely creates thermal tensions in the crystal of the zone molten, dislocation-free monocrystalline rod, which result in a uniformly distributed dislocation density, due to the specific selection of the annealing conditions, such as for example, the annealing temperature, the shape of the coil and the temperature of the annealing zone. The swirls which occur in the zone molten, dislocation free semiconductor rod, are thereby "healed" and disappear. "Swirls" are vacancy nests represented by spiral or cloudy concentrations of flat etching pits. They react with the dislocations which result from the annealing process.

The thus produced semiconductor material is less critical to some methods used in the production of components, than the dislocation-free semiconductor material, since no individual nests of dislocations that lead to great inhomogeneities, can occur. Dislocation containing material is also better suited for alloying processes thandislocation free material, since it effects a better and more uniform melting.

The method according to the teaching of the invention is characterized by a high reproducibility and by its simple execution and lends itself very well to automation.

The method of the present invention can also be coupled to great advantage with the zone melting processes, disclosed in German Pat. Nos. 1,148,525; 1,218,404 and 1,263,698.

It was found very advantageous to use an induction heating coil designed as a flat coil, for producing the annealing zone since said induction heating coil can keep the region of the semiconductor rod encompassed by the annealing zone to very small dimensions. This helps to produce the temperature differences in the crystal in relation to the adjacent region, which are required for producing the dislocations.

The annealing process is carried out in a vacuum or in a protective gas atmosphere (argon, nitrogen or hydrogen).

According to a particularly preferred embodiment of the invention, the annealing zone is moved at 1 to 2 mm/min through the semiconductor rod. At the same time, the semiconductor rod is rotated around its axis, at 60 rpm in order to support a uniform distribution of the dislocations.

It is within the scope of the invention to move the annealing zone through the semiconductor rod in opposite direction from the one used during zone melting. Thus, if zone melting is performed from below upward, then the annealing zone is moved through the rod from the top downward. The dislocations which exist in the cooling zone and stem from the zone melting process, serve as seeds during the pulling of the annealing zone.

The method of the invention is performed in an apparatus, which is suitable for vertical zone pulling and is illustrated in the Drawing.

The FIGURE shows a recipient designated 1. A retaining seal 2 is provided in the top of the recipient 1.

The seal 2 provides a vacuum tight passage for the drive shaft 3 of the zone molten, monocrystalline rod. The semiconductor rod 4, which is a silicon monocrystalline rod with a diameter of 27 mm, is held by a holder 5. The holder 5 may be moved, longitudinally, in the direction of the rod axis and may be rotated around its axis. Reference numeral 6 denotes the crystal seed, which at the beginning of the zone melting process, is fused to the lower end of the silicon rod and which in order to obtain a freedom from dislocation in the zone molten crystal has a smaller cross section and a bottleneck shaped constriction 7. The zone melting process, which is not described in detail and is assumed to be known, is effected upwardly from the bottom. Following the zone melting process, the silicon crystal rod 4 is cooled in the same apparatus (as illustrated) and an annealing zone 9 is produced at its upper end, by means of the induction heating coil 8. Used as the induction heating coil 8 is a flat coil having an inside diameter of 38 mm and an outside diameter of 62 mm. The induction heating coil 8 is led through a side wall of the recipient 1, in vacuum tight relation. The holder 10 of the induction heating coil 8, may be a coaxial holder which serves for the supply of current as well as of the coolant, preferably water. An observation window 11 is preferably provided on the opposite side wall of the recipient 1. The dimensions of the coil are appropriate for the particular rod. However, coils with other dimensions are obviously necessary for rods of other diameters.

The annealing process can be performed in a vacuum or in a protective gas atmosphere. The protective gas, e.g. argon, arrives from storage container 12, via a line system 13, into the recipient 1. The line system 13 contains a reducing valve 14, as a shut-off valve 15, as well as a pressure gauge 16.

The annealing zone 9 is adjusted to a maximum temperature of about 1370°C and is pulled from the cooling place through the rod downwardly from the top at a speed of 1.2 mm/min. The silicon rod 4 is rotated around its axis at 60 rpm.

After passing the annealing zone through the entire rod, a dislocation density of 100,000 dislocations/cm$^2$ is established uniformly across the entire rod length and the rod cross section. Crystal dislocations in form of lineages do not occur. The life span of the carriers, measured across the entire rod length is around 10 $\mu$S.

The device components which are also necessary for zone melting, such as the rod holder for the seed crystal, a vacuum tight passage or entry in the bottom of the recipient, are shown in the Figure by dash-dot lines.

What is claimed is:

1. Method of producing monocrystalline silicon having a uniform dislocation density in the range of 100,000 dislocations/cm$^2$ which comprises, in a crucible-free zone melting process, passing a molten zone through a rod situated in a recipient and with the aid of a seed crystal fused to an end of the rod converting the rod into a monocrystalline silicon rod free of dislocations, permitting the rod to cool, and then using the dislocations which exist on the end of the rod due to the zone - melting process as seeds, passing a heated zone through the dislocation-free monocrystalline silicon rod at a maximum temperature of 1370°C in the direction opposite to the direction of the zone melting process at a speed of 1–2 mm/min. to impart to said dislocation-free monocrystalline silicon rod a uniform dislocation density in the range of 100,000 dislocations/cm$^2$.

* * * * *